(12) United States Patent  
Green

(10) Patent No.: US 6,519,161 B1  
(45) Date of Patent: Feb. 11, 2003

(54) MOLDED ELECTRONIC PACKAGE, METHOD OF PREPARATION AND METHOD OF SHIELDING-II

(76) Inventor: William J. Green, 928 Terrace Lake Dr., Aurora, IL (US) 60504

(*) Notice: Subject to any disclaimer, the term of this patent is extended or adjusted under 35 U.S.C. 154(b) by 203 days.

(21) Appl. No.: 09/609,603

(22) Filed: Jun. 30, 2000

Related U.S. Application Data

(63) Continuation of application No. PCT/US98/27906, filed on Jun. 30, 2000.

(51) Int. Cl.$^7$ .................................................. H05K 1/18
(52) U.S. Cl. ..................... 361/761; 361/762; 361/763; 361/779; 174/52.1; 174/255; 174/256; 174/257; 174/260; 439/66; 439/68; 428/901; 165/185
(58) Field of Search .............................. 361/761, 744, 361/792, 810, 401, 412, 736, 748, 807, 762, 763, 779; 174/52.1, 255, 256, 257, 260; 439/68, 66; 428/902, 224

(56) References Cited

U.S. PATENT DOCUMENTS

| | | |
|---|---|---|
| 3,192,307 A | 6/1965 | Lazar |
| 3,205,408 A | 9/1965 | Boehm |
| 4,109,296 A | 8/1978 | Rostek |
| 4,374,457 A | 2/1983 | Wiech |
| 4,495,546 A | 1/1985 | Nakamura |
| 4,602,318 A | 7/1986 | Lassen |
| 4,773,955 A | 9/1988 | Mabuchi |
| 4,800,459 A * | 1/1989 | Takagi et al. ............... 361/321 |
| 4,801,489 A | 1/1989 | Nakagawa |
| 4,912,844 A | 4/1990 | Parker |
| 4,970,354 A | 11/1990 | Iwasa |
| 4,979,076 A | 12/1990 | DiBugnara |
| 4,985,601 A | 1/1991 | Hagner |
| 5,066,692 A | 11/1991 | Isawa et al. |
| 5,173,150 A | 12/1992 | Kanaoka |
| 5,341,274 A | 8/1994 | Nakatani |
| 5,371,654 A * | 12/1994 | Beaman et al. ............. 361/744 |
| 5,376,403 A | 12/1994 | Capote |
| 5,420,755 A | 5/1995 | Hiller |
| 5,492,586 A * | 2/1996 | Gorczyca ..................... 156/245 |
| 5,500,789 A | 3/1996 | Miller |
| 5,599,595 A | 2/1997 | McGinley |
| 5,639,989 A | 6/1997 | Higgins, III |
| 5,646,232 A | 7/1997 | Marrocco |
| 5,652,463 A * | 7/1997 | Weber et al. ............... 257/706 |
| 5,688,146 A | 11/1997 | McGinley |

OTHER PUBLICATIONS

"Guidelines for Molded Interconnetion Devices" Oct. 1990; IPC Standard.
"In Search Of Normal Resistor Distributions" Polymore Circuit Technologies.
"Polymer Thick Film Technology" Nov. 1991; TACL Manufacturing.
"Polymer Thick Film Technology (PTF)" Aug. 1990, EB Technology.
"Polymer Thick Film" 1996; Van Nostrand Reinhold.

* cited by examiner

*Primary Examiner*—Darren Schuberg  
*Assistant Examiner*—David Foster  
(74) *Attorney, Agent, or Firm*—Frederick J. Otto

(57) ABSTRACT

A packaged electronic circuit using molded plastics, Thick Film, and Polymer Thick Film technology, and achieving shielding of the circuitry and components of the package. In this invention at least one of electronic devices in the package is supported in a molded pocket in the molded substrate, and circuit traces are added to the surface of the substrate and the electronic device, simultaneously creating the circuit traces and making the interconnections with the components at the same time. Shielding, which is optional, can easily be printed over the planar surface of the circuit traces and components.

57 Claims, 8 Drawing Sheets

MOLDED ELECTRONIC PACKAGE, METHOD OF PREPARATION AND METHOD OF SHIELDING-II

This application is a continuation of PCT/US98/27906, filed Jun. 30, 2000.

TECHNICAL FIELD

This invention relates to the construction of a packaged electronic circuit comprising a molded-plastic support base having a capacity to accept and hold electronic devices or subassemblies thereof in a pocket within the molded substrate, and positioning them for interconnection (hereinafter referred to as "Molded Electronic Package"). The connection to the electronic devices or subassemblies is intricately formed with the placement of the circuit traces on the substrate. This is an advantage over existing technology because it offers savings both in cost and space. This is usually done at the surface level. The formation of the circuit traces by printing with Polymer Thick Film and the attachment to electronic devices is achieved by Polymer Thick Film printing technology and the substrate is formed with plastic molding technology. The electronic devices may be semiconductors, integrated circuits, electromechancial devices, other active components, passive components such as Thick Film resistors or capacitors, or other devices as defined later. While molded substrates are not new, and the use of Polymer Thick Films technology and Thick Film Technology are not new, the combination of a molded substrate with a pocket built into the molded substrate and interconnecting the electronic devices in the pocket with Polymer Thick Film technology is new and fulfills a long-felt need to be able to reserve the surface area above the trace area for other circuits traces and electronic devices. Others have tried to accomplish this by other means of interconnecting by layering circuit boards as discussed below, but only with the advent of the new Polymer Thick Films and the new molded plastic resins which have only recently become available can we now accomplish the connecting of the electronic device in the pocket of the substrate material. The pocket permits the electronic device to be supported by the substrate instead of being supported on the trace which allows for the use of the new Polymer Thick Film technology to connect the electronic devices which previously did not exist. This long felt need to further reduce the size of circuit boards for ever smaller products while containing or reducing costs of the resulting circuits has until now been unanswered by conventional methods.

BACKGROUND ART

A traditional printed circuit board comprises a supporting substrate and copper-foil circuit traces. These traces are usually formed by the chemical etching of a pattern defined onto a laminated copper surface. Sometimes both front and back sides of the substrate carry circuit traces. Two-sided, or double-sided designs usually are interconnected through vias (holes) that have copper deposited around the hole walls. A related technology exists known as Thick Film. Here the supporting substrate comprises flat, thin pieces of alumina ($Al_2O_3$) on which the traces are printed with an ink containing metal, glass frit, and other additives. When fired at the correct temperatures the ink fuses to form conductive traces to which components can be soldered. An important feature to Thick Film technology is that conductive traces can be interconnected by printed inks having specific electrical resistivity after being heated in a kiln (firing).

A lessor-known technology exists known as "Polymer Thick Film" wherein conductive traces can be prepared on printed circuit board substrate using polymer inks that contain polymer resins and metals, usually silver. Typically heat is used to cure or set the polymers in the inks to form reasonably stable circuit traces. In a manner similar to the Thick Film process, carbon-filled inks can be used to interconnect circuit traces with specific electrical resistances. Carbon prints, known as Polymer Thick Film resistors, can be printed onto traditional copper foil traces, or onto printed Polymer Thick Film conductive circuit traces.

Countless variations of printed circuit boards exist, and many variations of the Polymer Thick Film process also exist. One application of both the printed circuit board process and the Polymer Thick Film process is the Molded Circuit board. Here the process of converting a laminated sheet of material into the proper circuit board dimensions and having all the necessary holes, slots, and shapes are replaced by molding these features into the board. Circuit traces are applied to a board either during or after the molding process. One method for adding the traces was to print them with conductive Polymer Thick Film inks.

In the past the molded board with Polymer Thick Film traces (baking of the Polymer Thick Film ink creates the conductive circuit traces) found limited acceptance for a number of reasons. Printed Polymer Thick Film conductive traces have more resistance than copper foil traces. Also, electronic devices cannot be soldered to most Polymer Thick Film traces. Those electronic devices that were attached to solderable Polymer Thick Film inks did not have good adhesion to the molded substrate after the soldering process. Some Polymer Thick Film conductive inks contain lead which causes environmental concerns and which limits the ability to recycle the materials. Additionally, the molded plastic that could withstand soldering temperatures without warping were the engineering grade materials which are higher quality performing materials. These are more expensive, however, and when used, the cost advantage of the molding process is often lost. Some simple applications of the Molded Board with Polymer Thick Film traces (but without pockets) designed to fit into a connector have been used commercially, but in general commercial production of this type product has been limited.

Printing conductive layers over circuit board traces that are connected to and grounded by a ground plane is a known way to achieve shielding of the traces covered. The circuit traces are first sealed in an insulating layer, and then overprinted with a conductive layer. With this traditional approach it is not possible to shield the components which are attached to the circuit traces, but only the traces themselves.

Lassen's U.S. Pat. No. 4,602,318 describes achieving high density electronic networks by depositing filaments onto a substrate and encapsulating the filaments to achieve dimensional stability. Filaments are conductive or made conductive by various means. Access to these conductive traces is produced with the use of a high energy beam to cut through and expose the filaments. Lassen claims the use of epoxy resin sheets, and polyimide resin sheets to create his circuitry.

Parker's U.S. Pat. No. 4,912,844 describes using a heated punch to define grooves and holes in a substrate. The grooves are then filled with solder to create a circuit trace which connects electronic devices. Beaman's U.S. Pat. No. 5,371,654 describes a three dimensional electronic package with a plurality of assemblies interconnected by aligning the assemblies so they are adjacent, and interconnected by some means such as an elastomeric material, but other than a Polymer Thick Film.

Capote's U.S. Pat. No. 5,376,403 describes ink formulations which can be used to form circuit traces, but Capote does not describe or claim uses for his ink.

Hiller's U.S. Pat. No. 5,420,755 places a component in a hole cut into standard circuit board material, but does not claim using molded pockets in circuit boards. The component is attached with a standard solder connection. Placement of the component is in a cut hole and the solder joint is not different from using any common commercial solder joint to connect the electronic devices.

McGinley's U.S. Pat. Nos. 5,599,595 and 5,688,146 describes how circuit traces can be added to molded plastic to achieve a printed connector assembly. McGinley uses current technology to attach printed Polymer Thick Film conductive traces to the top surface of the Polymer Thick Film traces. McGinley uses current Polymer Thick Film methods to print resistors on the circuitry of the connector.

Marrocco's U.S. Pat. Nos. 5,646,231, 5,646,232, and 5,654,392 describe the use of rigid rod polymers to form a plastic molded circuit board. No mention is made as to how this is done, nor are any claims made concerning molded pockets in the substrate or attachments of the electrical devices placed in the pockets.

Nakagawa's U.S. Pat. No. 4,801,489 and Iwasa and Marooka's U.S. Pat. Nos. 5,066,692 and 4,970,354 describe how printed conductive inks can be used to create shielding properties on printed circuit boards, however all of these patents are for shielding on printed circuit boards. In my invention there is no circuit board, but rather a molded substrate containing inserted components. Also, In my invention the entire package may be shielded, and not just the circuit traces. This is a significant advantage over printed shielding that shields only the traces.

Higgins' U.S. Pat. No. 5,639,989 describes how shielding of both circuit traces and components mounted on the substrate can be achieved. Higgins patent would require applying an insulating layer over both traces and components and then applying a conductive layer over the insulating layer which connects to a ground plane. This is awkward to achieve since the surface is not planar, and these layers must be applied by spraying, dipping, pad printing, or some other method for applying a uniform thin layer to an irregular surface. In my invention the circuitry and components form a planar surface, and the layers can be easily printed with screen printing or any other common commercial printing process.

DISCLOSURE OF INVENTION

The present invention provides a cost effective, highly functional packaged electronic circuit by combining the advantages of molded substrates, Thick Film construction, and Polymer Thick Film technology in a single package. The substrate may also be vacuum formed plastic, and shielding of both circuit traces and components contained in pockets of the molded substrate may be achieved. All of these features are important developments that address the driving forces of the electronic packaging industry, and that is to create smaller and less expensive packaging alternatives. To do this I designed the molded support to accept inserted electronic devices and connecting them with additive circuitry which both adheres to the substrate and interconnects the individual components. In FIG. 1 one variation of this concept is shown. The attached electronic devices may comprise a resistor, a capacitor, an LED, or it can comprise an electro-mechanical device such as a connector pin or an off/on switch, or a bioelectrical functional component. Other simple functional features may also be incorporated into the molded design such as heat sinks, pins that connect front-side circuitry to back-side circuitry, or thermal vias (holes or openings in the board). The electronic device in the pocket may attach on a planar level of the substrate (horizontal plane, two dimensional), or the electronic device in the pocket may attach either below or above the plane of the face of the molded substrate (three dimensional, vertical plane, in the z-axis of the substrate).

Subassemblies, which are smaller circuits complete with their own electronic devices and usually constructed on ceramic substrate, can also be attached in the same manner as electronic devices. This could include ceramic circuitry (complete with active and/or passive components). It could also include ball-grid arrays or chip scale packages. Multichip Modules can also be built up using molded substrates, chips inserted into pockets, and the attachment techniques defined in this document.

The traditional circuit board package begins with a substrate which supports the circuit traces while in the Molded Electronic Package the molded substrate supports both the circuit traces and the electrical devices, and the interconnection of the components is achieved by forming the circuit traces over both the electrical devices and the substrate. Connection can be directly to the electrical devices or can be through vias (small openings or holes) in an insulating layer which covers the electrical devices. In the Molded Electronic Package connection can be directly by the trace or by a second material, such as a solder-paste or a conductive adhesive that is an extension of the trace.

Benefits of this construction are as follows:

1) Since the electronic device is securely held in the pocket by the molded substrate, the electronic device need no longer rely on the adhesion of a Polymer Thick Film conductor ink to the substrate to remain secure in the circuit. Thus, this requirement of attachment or holding of the electronic device is no longer important in the selection of a Polymer Thick Film conductor used to form the circuit traces.

2) Interconnection options are now available that do not require the extreme high temperatures of the soldering process. We therefore have a broader choice of molding material from which to prepare the molded substrate making possible less expensive circuitry.

3) Because electronic devices, especially resistors, can be packaged in pockets in the board in the z-axis rather than mounted to the surface of the board, valuable space is now made available for the attachment of other components. This is a very valuable feature when trying to design more compact circuitry.

4) Because a wide range of materials are available for construction of the supporting molded plastic substrate, the design engineer can take advantage of different dielectric properties such as dielectric constant, voltage breakdown resistance, and loss tangent. This only becomes possible because Molded Electronic Package packaging resolves the problems of heat sensitivity and adhesion properties as discussed above.

5) Because electronic devices such as resistors can now be mounted under the circuit traces in pockets in the molded plastic substrate rather than on top of the traces, one can now route traces to different parts of the circuit without resorting to multi layering the circuitry to avoid crossing the traces.

6) Resistor networks can now be designed below the circuit traces with a higher packaging density than possible with resistors mounted on top of traces, because the connection joint between the trace and the electronic device is no longer also serving as the physical support for the electronic device, and it can therefore be a smaller, more finite joint.

7) Choices of polymer resins are available for the supporting substrate, one being Polyimide, the prefered embodiment, and also are polymers and copolymers of Epoxies, Phenolics, thermoset Polyesters, Syndotactic Polystyrene, Polyethylene Terephthalate, Polybutylene Terephthalate, Polyphenylene Sulfide, Polyamide, Liquid Crystal Polymers, Polyphenylene Oxide, Polycyclo Terethalate and rigid rod polyphenylene. With the broad choice of polymer resins it is now possible and practical to design, build and use circuitry that can be recycled.

8) The preparation of Molded Electronic Package circuitry can be achieved without costly, environmental risky processes, such as the use of lead solders and acids for etching, which are necessary in the current printed circuit board industry.

9) The capitalization required to set up this Molded Electronic Package process is much less than for other printed circuit board factories.

10) Since molded substrates have their physical dimensions defined in the molding process they can be easily stacked in magazines for printing and baking on automated equipment. It is not practical to process traditional circuit board substrates in this way because they must be handled in large sheets to achieve economical conversion to the final size and shape. The adaptability of the Molded Electronic Package to automated handling means its user could set up manufacturing in the country of choice instead of in cheap labor markets as is common in the printed circuit board industry today.

11) Silicon chips can be placed into pockets and attached directly to the Molded Electronic Package board without mounting them first in one of the many carrier alternatives currently used. This not only reduces cost and saves space, but allows easy rework of faulty chips by simply removing the faulty chip from the pocket, inserting a new one, and repeating the printing process which attaches the chip.

12) Since resistors, sub assemblies, and other components can be located in the board and under the circuit traces rather than on the board and over the circuit traces, it is now possible to use an economical print process to seal both the circuitry and the components in dielectric, and overprint the package with a Polymer Thick Film conductive shielding layer.

13) Extremely low cost circuitry can be prepared from vacuum formed plastic. In this process inexpensive sheets of plastic are formed three dimensionally under heat and vacuum pressure. This inexpensive process can be used to form the pockets for inserting components, and other dimensional requirements at the same time.

BRIEF DESCRIPTION OF DRAWINGS

These and other objects, features and advantages of the present invention will become apparent upon further consideration of the following detailed description of the invention when read in conjunction with the figures, in which:

FIGS. 1 through 8 show the use of a solder mask to seal portions of the assembly. The solder mask is performing as an insulating protective layer. Other printed polymer dielectrics exist for this purpose that are not solder masks. Dielectrics can offer specific electrical properties such as dielectric constant, loss tangent, and voltage breakdown properties which can be important in the design of a circuit.

BEST MODE FOR CARRYING OUT THE INVENTION

Figure 1:
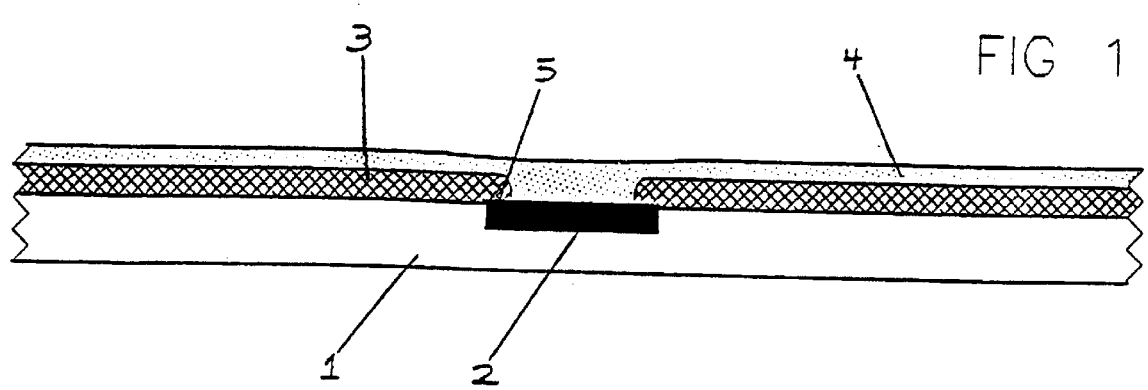
FIG. 1 is a side view of an electronic device inserted into a molded pocket and connected by a printed Polymer Thick Film conductive ink. The assembly is sealed in a solder mask.

The novel combination of Thick Film, Polymer Thick Film, and plastic molding technology forms the basis of the cost savings and design advantages of this invention. The specific role of the molded substrate is to give form and support for the electric package. If the dielectric properties of the substrate become part of the function of the circuit, the role of the molded plastic is to optimize performance by providing the correct dielectric properties. In all cases the substrate provides electrical insulation between circuit traces. The role of the Thick Film is to provide passive functions, such as resistance or capacitance, within the electrical circuit. Thick Film constructions can also provide subassemblies containing active electronic devices and functions, such as transistors, diodes, integrated circuits, and other similar devices used in the packaging of electronic circuits. The function of Polymer Thick Film in this combination is to provide the interconnecting traces of the circuit. This fills the role served by the etched copper traces of a traditional printed circuit board. The Polymer Thick Film circuit traces are deposited normally by printing. The materials that can be used for printing circuit traces include inks filled with conductive fillers, such as silver, copper, silver plated copper, carbon, and could include any other filler that produces a suitable electrical conductive current path. The Polymer Thick Film conductor can also be a non conductive material which, when printed, provides a sensitized trace which accepts metal plating, and in this way produces an electrically conductive path. The metal deposited in the plating process will provide the conductivity while the printing material only defines the image to selectively accept metal plating.

Polymer Thick Film materials can also provide other functions within the circuitry, such as resistance, capacitance, and dielectric separation between layers of a multilayer construction. These functions can be part of the total construction, but are not novel to this invention. It is the interconnection of the electronic devices that are held within the molded frame that is an improvement over existing technology.

Polymer Thick Film materials can be used to print solid layers of conductive material over a circuit which is insulated with a insulating dielectric material. When a solid layer is required on one surface of a circuit, known as a ground plane, this also can be printed with Polymer Thick Film materials.

Because the circuitry and the components are constructed to have a common planar surface it is now possible to seal this surface with a insulating layer, or dielectric layer, and then cover the entire surface (or any portion thereof) with a conductive layer that is grounded. In this way shielding of the circuit is complete. Both components and circuit traces are enclosed in the same shielding envelope. This is not economically possible when the components are soldered to the surface of a printed circuit board, or attached with wire leads. Shielding of electronic packages is becoming more and more important, and this technology is best suited for being prepared with an inexpensive printed or plated conductive layer.

Throughout this description electronic device is defined as a passive component which serves a function within the circuit such as a resistor or capacitor, or an active component such as a transistor or a diode or an integrated circuit, or a semiconductor, or a multichip Module, or a silicon chip. An electronic device can also be a plastic ball grid array or a chip scale package, or a subassembly of circuitry and components. An electronic device can also be an electromechanical device such as a connector pin or an off/on switch, or a bioelectrical component.

Throughout this description Thick Film is defined as that process for preparing electronics circuitry that uses ceramic materials in the ink formulations in contrast to Polymer Thick Film where the ink formulas are based on polymer materials.

Throughout this description a molded substrate is defined as a support for an electronic circuit molded from any available plastic resin suitable for the purpose such as Polyether Imide which is preferred for its combination of low cost, ability to withstand high temperature exposures as experienced in a commercial soldering process, ability to mold flat, remain flat throughout subsequent processing, and its formation of strong adhesive bonding with most Polymer Thick Film inks. Other plastics that can be used to construct molded substrates include, but are not limited to Epoxies, Phenolics, thermoset Polyesters, Polyethylene Terephthlate, Polybutylene Terephahlate, Polyphenlyene Sulfide, Polyamide polymers and copolymers, Liquid Crystal Polymers, Polyphenlyene Oxide, Polycyclo Terethalate, Syndotactic Polystyrene, and rigid rod Polyphenylenes. In the examples given in this description a specific size is given for the pocket and the electronic device inserted into the pocket. This is a practical and convenient size, both for an example and for actual assembly, however the specific size is given for example only, and an infinite number of sizes could be used.

Throughout this description a Polymer Thick Film conductor ink is defined as any ink, screen printed, pad printed, or printed with any other commercial process which deposits material that upon processing will conduct electricity with a resistivity low enough for the print to serve as a conductive trace in an electronic circuit. This is normally less than one tenth of an ohm per square in sheet resistance as printed. Examples of Polymer Thick Film conductor inks are Asahi LS 504J Silver, Asahi LS 506J Silver, Asahi Copper CU-051, and Grace 4001 Silver.

Throughout this description a fusible Polymer Thick Film conductive ink is defined as an ink which contains metal fillers which upon processing melt and solidify in a manner similar to solder reflowing, and which upon processing form an adhesive bond to the supporting substrate. Such inks usually have low resistivity and are capable of accepting solder to form a solder joint between a conductive trace and a electronic device. Examples of fusible conductor inks are SVT EU 1328, Kester Ormet 1200, and Kester Ormet 2005.

Throughout this description a conductive adhesive is defined as a blend of polymers and conductive fillers such as metals which when applied joins a circuit trace and a electronic device and upon processing forms a conductive joint.

FIG. 1 shows the molded substrate 1 holding an electronic device 2. The traces are connected in the circuit by a printed Polymer Thick Film material 3 such as Asahi LS 504 J Silver ink that produces both conductivity for the circuit traces and connection to the component. The substrate is shown as planar (flat), but may also be non-planar (not flat-three dimensional). A solder mask layer 4 seals the package. The advantage to this process is that the silver ink is easy to use and has fewer processing steps. The disadvantage is that silver inks have more resistance than copper foil, and they normally do not accept solder as may be required in some other assembly process. The point of attachment 5 between the conductive trace and the electronic device is where the conductive ink falls directly onto the electronic device. The ink forms an adhesive bond to the component making the electrical connection. The ink can also be a fusible Polymer Thick Film conductive ink such as SVT EU 1328 which accepts solder attachment and therefore has an advantage over conventional silver inks.

Figure 2:
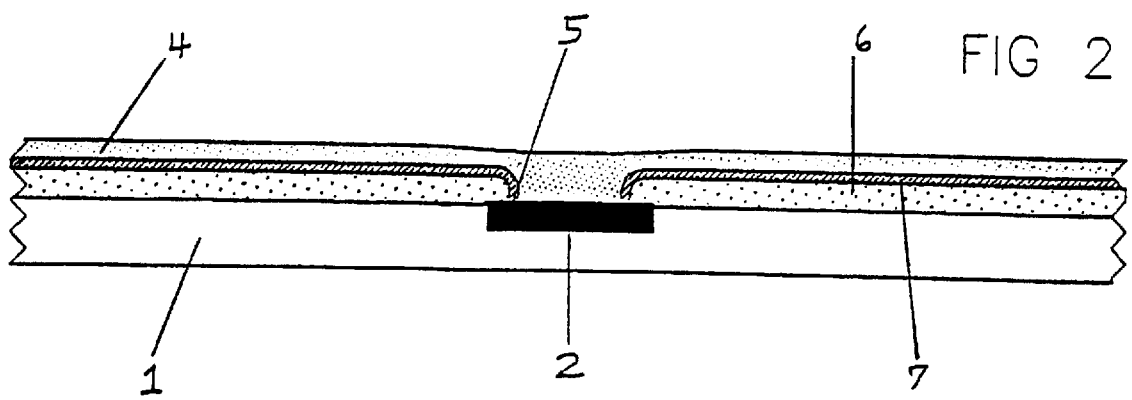
FIG. 2 is a side view of an electronic device inserted into a molded pocket and connected by a printed Polymer Thick Film ink that accepts copper plating to become conductive. The electronic device also accepts plating as the means of attachment to the circuit. The assembly is sealed in a solder mask.

FIG. 2 shows a variation of this concept where the molded substrate 1 holds an electronic device 2. The traces may be connected in the circuit by a printed Polymer Thick Film material 6 that has been plated with copper 7 to produce both conductivity and electrical connection to the electronic component. A solder mask 4 layer has sealed the package. Notice that no solder is needed to connect the traces to the electronic device. The plating process provides both a conductive path and connection, or the point of attachment 5, to the electronic device. The Polymer Thick Film conductive trace can be a non-conductive sensitizing ink such as Asahi ACP 007-2P, or it can be a conductive inks such as Asahi Cu 051 Copper ink, Asahi LS 504 J Silver ink, Asahi 30 SK Carbon ink, or any ink by any manufacturer that functions in a manner similar to those mentioned. This approaches the conductivity of copper foil. A disadvantage of the Asahi ACP 007-2P is an additional processing step to plate the copper onto the printed Polymer Thick Film ink.

Figure 3:
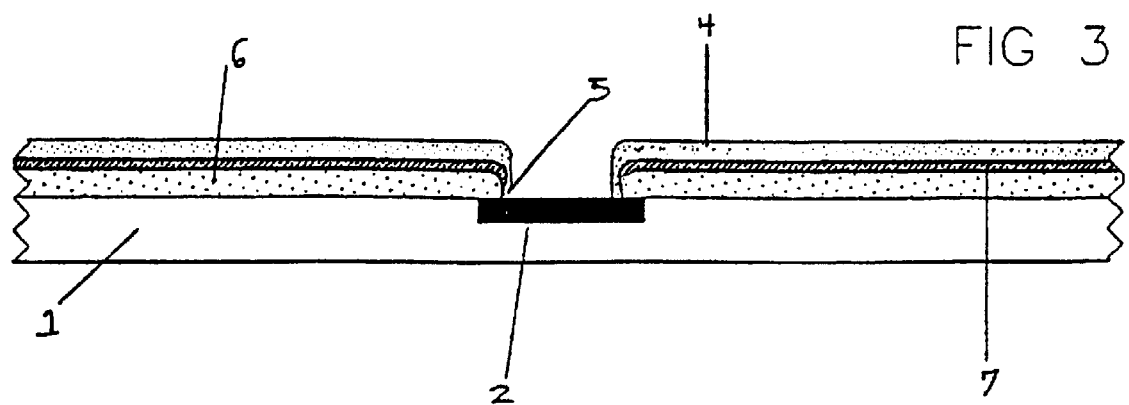
FIG. 3 is a side view of an electronic device inserted into a molded pocket and connected by a printed Polymer Thick Film ink that is both conductive in itself and accepts copper plating to enhance its conductivity and/or solderability. The electronic device does not accept the copper plating, but is connected by the adhesion of the printed Polymer Thick Film conductive ink. The assembly is sealed in solder mask.

FIG. 3 shows a variation of the concept in FIG. 2 where the copper plating 7 does not occur directly onto the component 2. Here the principal carrier of the current is the copper plating 7 which is plated onto the Polymer Thick Film ink 6, however here the Polymer Thick Film ink serves a dual role. It sensitizes the image to be plated, and it forms an electrical conductive bond to the electronic device in a manner similar to a conductive adhesive. The point of attachment, 5, is between the Polymer Thick Film ink 6 just as in FIG. 1.

Figure 4:
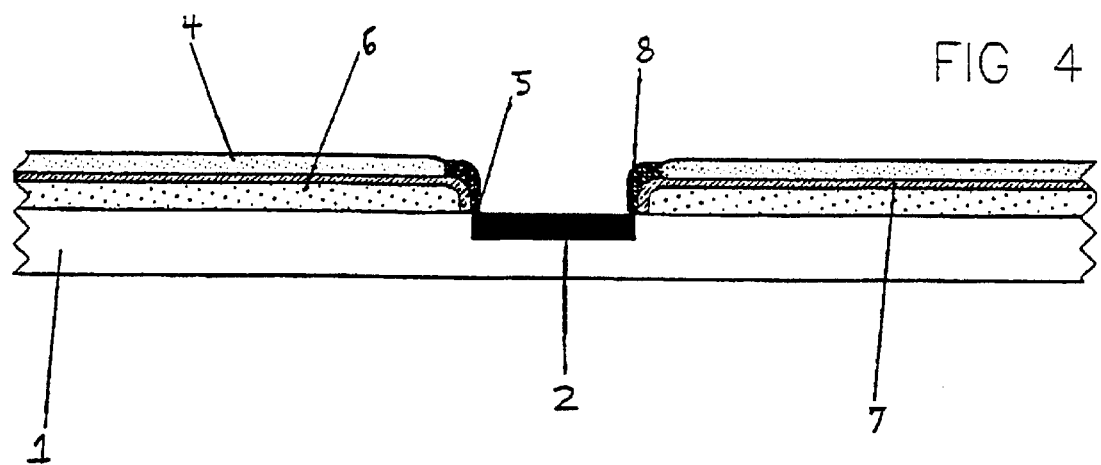
FIG. 4 is a side view of an electronic device inserted into a molded pocket and connected to a printed Polymer Thick Film ink that accepts copper plating to become conductive and solderable. The electronic device connection is made by a solder joint. The assembly is sealed in a solder mask.

FIG. 4 shows a variation of this concept in FIG. 2 where the copper plating 7 on the conductive ink 6 does not connect to the component 2 held by the molded substrate 1, but only brings the trace adjacent to the electronic device. A second material 8 is then used to make the connection from the trace to the component. This second material can be a solder material, such as Multicore's WS 12AAS88, a conductive adhesive such as Multicore's M-4030 Ag/TP, or a fusible Polymer Thick Film ink such as Summit Valley Technologies EU 1328, or any material by any manufacturer that performs in a manner similar to those mentioned. The advantage of this variation is a broader choice of electronic devices that can be connected in this manner, and the ability to design a product to meet specific performance requirements such as flexibility of the substrate base, heat stability, or the reduction in lead content. The circuit is protected by a solder mask or dielectric layer 4. The point of attachment 5 is then a combination of the bonding between the copper plating 7 and the solder (or conductive adhesive) 8 which bonds to both the copper plating 7 and the component 2.

Figure 5:
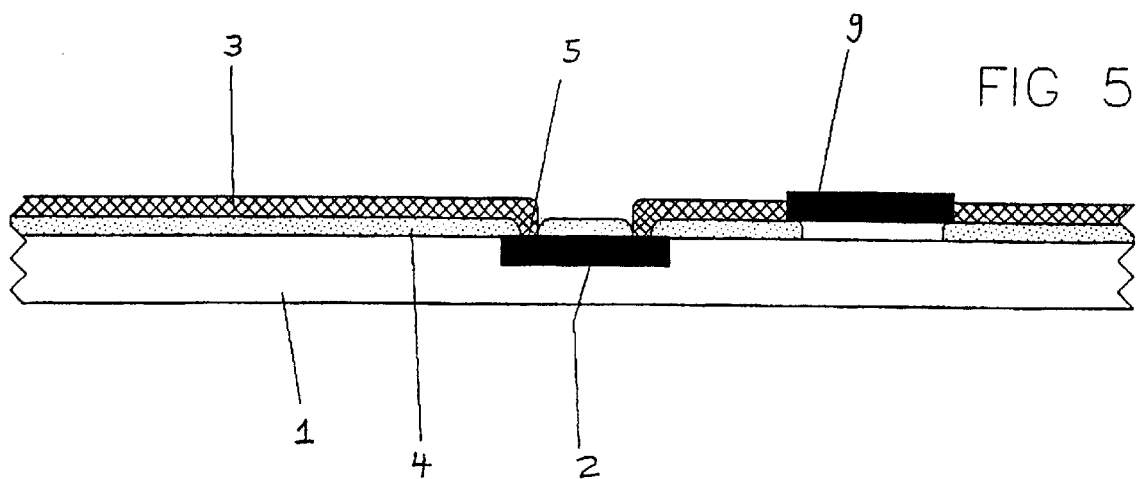
FIG. 5 is a side view of an electronic device inserted into a molded pocket and sealed by a printed solder mask. Openings in the solder mask (also known as vias) provide the site through which the printed Polymer Thick Film ink is connected to the electronic device.

FIG. 5 shows another variation of this concept where a Polymer dielectric layer such as a solder mask 4 covers the molded substrate 1 so that the surface chemistry of the surface to which the polymer conductive trace 3 must bond is enhanced. The layer can either cover only the molded surface or it may cover both the molded plastic and a portion of the electronic device. If the electronic device 2 is covered, attachment to the electronic device is through vias in the dielectric layer 4 of the circuit. A fusible Polymer Thick Film conductive ink such as SVT EU1328 is used and a surface mount electronic device 9 is placed onto the ink traces while the ink is still wet. The assembly is processed in a hot vapor reflow oven at 215° C. for two minutes which attaches a surface mount electronic device and forms the point of attachment 5 for the inserted electronic device.

Figure 6:
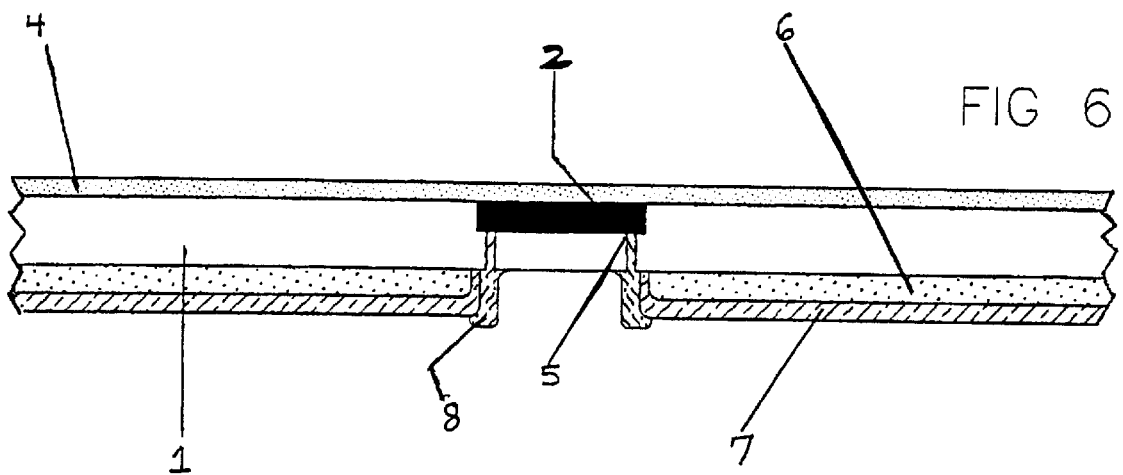
FIG. 6 is a side view of an electronic device inserted into a molded pocket and connected by a printed Polymer Thick Film ink that accepts copper plating to become conductive. The electronic device is sealed on its top surface by a printed solder mask, and the connection to the electronic device is made through molded vias from the reverse side of the board. In this case a conductive adhesive makes the connection between the conductive trace and the terminal sites of the electronic device.

FIG. 6 shows another variation of this concept, but here the trace printed is a non conductive Polymer Thick Film ink 6 which is copper plated 7 and connected to the electronic device 2 through molded vias in the reverse side of the substrate 1 while the pocket remains on the other side. Preferably the connection is made with a conductive adhesive 8. This point of attachment 5 can also be made with a fusible polymer Thick Film ink such as SVT EU1328, any suitable commercial solder paste such as Multicore's WS12AAS88, or the natural conductivity of a silver Polymer Thick Film conductive ink such as Asahi LS 504J. The advantage of this design is to free the top surface of the package for construction of other circuit functions.

Figure 7:
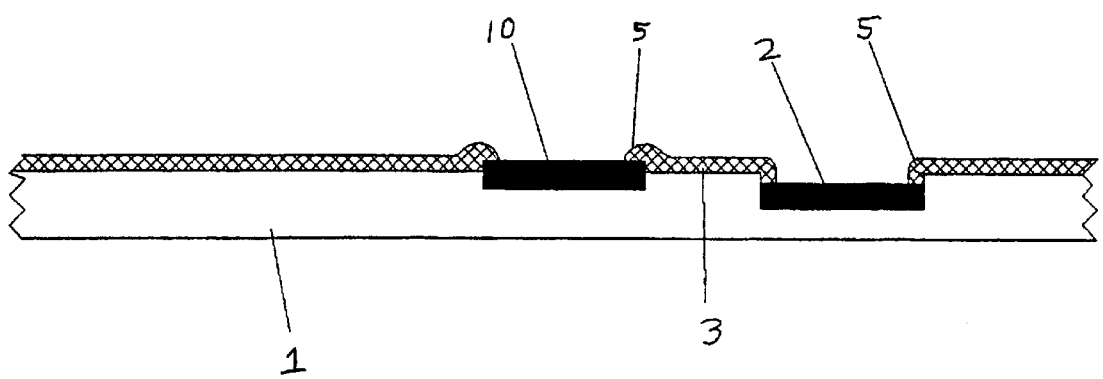
FIG. 7 is a side view of two electronic devices inserted into two different molded pockets in the substrate. One electronic device sets slightly above and the other slightly below the horizontal plane of the substrate. Both are connected with the printing of the Polymer Thick Film conductor used to form the conductive traces of the circuit.

FIG. 7 shows the molded substrate 1 holding two electronic devices 2 and 10 such as Thick Film resistor networks or some other electronic devices. The traces are printed to form a circuit using a Polymer Thick Film material such as Asahi LS 504J Silver ink or SVT EU 1328 fusible conductive ink that produces both conductivity for the circuit traces and connection to the electronic devices. One electronic device 10 is slightly raised above the surface of the substrate 1 and the second device 2 is slightly lower that the surface of the substrate 1. The point of attachment 5 between the conductive Polymer Thick Film ink 3 and the electronic device is where the conductive Polymer Thick Film ink falls directly onto the electronic devices 2 and 10. The ink bonds to the electronic devices making an electrical connection. Even though devices 2 and 9 are not flat with the substrate 1, attachment is still possible and situations may arise where this condition may even be preferable.

Figure 8:
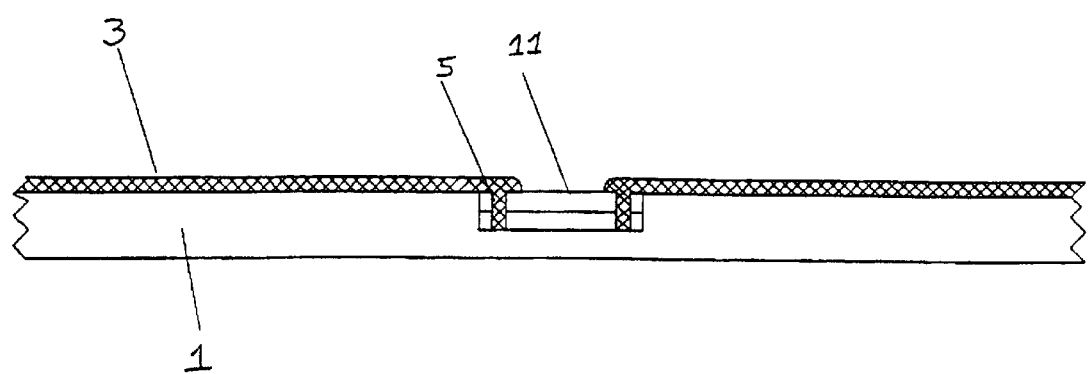
FIG. 8 is a side view of a subassembly inserted into a molded pocket of the substrate. This subassembly consists of several layers of circuitry and could have other electrical devices incorporated into its design. The entire subassembly is connected by the Polymer Thick Film conductive traces which are printed onto the substrate and the subassembly. The conductive material also connects the different layers of the subassembly, however, this interconnection could be intricate within the subassembly with the Polymer Thick Film connection only made to the top surface of the subassembly.

FIG. 8 shows the molded substrate 1 holding a multilayer subassembly 11 in the pocket of the substrate 1. The traces are printed to form a circuit using a Polymer Thick Film material 3 such as Asahi LS 504J Silver ink or SVT EU 1328 fusible conductive ink that produces both conductivity for the circuit traces and connection 5 to the multilayer subassembly 11. The point of attachment 5 between the conductive trace and the subassembly is where the conductive ink 3 falls directly onto the multilayer subassembly. All layers of the multilayer can be attached at this point, or they can be independently connected within its own structure. The ability to place more than one electrical device or multilayer subassemblies which can have layers of circuitry on each surface used to construct the multilayer expands greatly the functionality of the package.

Another variation of this invention is that of an active electronic device, such as a silicon chip, integrated circuit, or semiconductor, can be connected in the circuit in any of the processes shown in FIGS. 1–8.

Another variation of this invention is using a subassembly, such as ceramic circuit to which other components are, or can be, attached.

Another variation of this invention is when the electronic devices made on separate plastic moldings are inserted into the Molded Electronic Package in place of the Thick Film components or sub assemblies.

Another variation of this invention is when electronic devices made on printed circuit board materials such as FR4, FR2, CEM1, CEM3, and polyimide laminate are inserted into the Molded Electronic Package in place of the Thick Film electronic devices or sub assemblies.

Another variation of this invention is when a dielectric material is used to seal the entire package, or a portion thereof, and a Polymer Thick Film conductive material is used to shield the circuit traces and the inserted components.

EXAMPLE 1

A substrate is molded of a preferred material commonly called Polyether Imide, but may be molded from such materials as but not limited to Polyethylene Terephthalate, Polybutylene Terephthalate, Polyphenylene Sulfide, Polyamide, Liquid Crystal Polymers, Polyphenylene Oxide, Polycyclo Terethalate, thermoset Epoxies, thermoset polyester, thermoset Phenolic, syndotactic polystyrene or a rigid rod polyphenylenes. The molded substrate contains a pocket 0.5 cm by 1.25 cm and 0.25 cm deep. A ceramic substrate of the same or slightly smaller dimensions on which is printed a resistor array is placed in this pocket. Circuit traces are printed on the molded substrate with a Polymer Thick Film conductive ink such as Asahi LS 504 J and cured at 140° C. in a box oven for 30 minutes or on a conveyorized infrared belt furnace at a setting to give the same degree of cure. The circuit traces terminate directly on the terminal sites of the electronic device, and in this way attachment is achieved. This attachment is simultaneous with the formation of the circuit on the substrate.

EXAMPLE 2

A substrate is molded of a suitable material such as described in Example 1 and fitted with an electronic device inserted into a molded pocket as described in Example 1. Circuit traces are printed on the molded substrate with a Polymer Thick Film conductive ink such as Asahi ACP-007-2P Copper paste and cured at 150° C. for 30 minutes in a box oven or on a conveyorized infra red belt furnace at a setting to produce the same degree of cure. The circuit traces terminate directly on the terminal sites of the electronic device. The assembly is placed in an electroless copper bath such as Enthone CU-705. As copper plated on the electronic device and the Polymer Thick Film traces the circuit become electrically conductive, and at the same time attachment of the electronic device is achieved.

EXAMPLE 3

A substrate is molded of a material such as described in Example 1 and fitted with an electronic device inserted into a molded pocket as described in Example 1. Circuit traces are printed on the substrate with a Polymer Thick Film conductive ink such as Asahi ACP-051 Copper paste and cured at 150 degrees C. for 30 minutes in a box oven, or on a conveyorized infra red belt furnace at a setting to produce the same degree of cure. The circuit traces terminate directly on the terminal sites of the electronic device, and in this way attachment of the electronic device is achieved. This attachment is simultaneous with the formation of the circuit on the substrate. The circuit is naturally solderable and other electronic devices can be attached by soldering. The circuit can also be copper plated as in Example 2 to enhance conductivity, solderability, and or the quality of the attachment to the electronic device in the pocket.

EXAMPLE 4

A substrate is molded of a material such as described in Example 1 and fitted with an electronic device in the molded pocket as in Example 1. Circuit traces are printed on the molded substrate with a Polymer Thick Film conductive ink such as Asahi ACP-007-2P Copper paste and cured at 150 degrees C. for 30 minutes in a box oven, or on a conveyorized infra red belt furnace at a setting to produce the same degree of cure. The circuit traces terminate next to but not directly on the terminal sites of the electronic device. The assembly is placed in an electroless copper bath such as Enthone CU-705. As copper plates onto the Polymer Thick Film traces the circuit become electrically conductive. Attachment of the electronic device is achieved by applying and reflowing a solder paste such as Multicore WS 12AAS88.

EXAMPLE 5

An alternative to Example 4 is to make the attachment with a conductive adhesive such as Multicore M-4030 Ag/TP or an fusible ink such as SVT EU 1328. The process for curing the conductive adhesive is to apply the material and bake it in a box oven for 30 minutes at 140 degrees C. The process for reflowing the fusible ink consists of heating in a Hot Vapor Reflow process for 2 minutes at 215° C., or heating the ink in a conveyorized infra red oven, or any commercially available heat transfer process available for melting (reflowing) solder.

EXAMPLE 6

A substrate is molded of a material such as described in Example 1, and fitted with an electronic device in a molded packet as described in Example 1. The assembly is overprinted with a dielectric such as Asahi CR-20G ink which has vias to expose the termination site of the inserted component. Circuit traces are printed on the molded substrate with a Polymer Thick Film conductive ink such as SVT EU 1328. A surface mount component such as a resistor is also placed onto the circuit while the ink is still wet. The assembly is dried at 120° C. for 5 minutes and then reflowed in a hot vapor furnace at 215° C. for 5 minutes. The circuit traces terminate directly on the terminal sites of the electronic devices, and in this way attachment is achieved upon reflow of the ink. This attachment is simultaneous with the formation of the circuit on the substrate.

EXAMPLE 7

A substrate is molded of a material such as described in Example 1, and fitted with an electronic device inserted into a molded pocket as described in Example 1. The entire surface of the assembly is sealed with a dielectric print using Asahi CR-20G dielectric ink. circuit traces are printed on the reverse, or back side of the board using Asahi ACP-007-2P copper ink which is cured at 150° C. for 30 minutes in a box oven or on a conveyorized infra red belt furnace at a setting to produce the same degree of cure. The assembly is placed in an electroless copper bath such as Enthone CU-705 for the proper amount of time to achieve an electroless deposition of copper on the printed traces. This usually requires about 30 to 45 minutes. Vias have been molded in the substrate to give access to the termination site of the component from the reverse, or back side of the substrate. A conductive adhesive such as Multicore's M-4030 Ag/TP is deposited to achieve an electrical connection between the conductive traces and the termination sites of the electronic device which are exposed by the vias in the molded substrate.

EXAMPLE 8

In examples 1–7 the components have termination sites to which attachments are made, but they do not have leads (metal wires or flat metal extensions from the termination sites). Any of the electronic devices in examples 1–7 that can be acquired as leaded components are assembled in this example by mounting them in molded pockets that support the device and its leads so that one is able to interconnect the leads of the device using the Polymer Thick Film materials and processing described in examples 1–7.

EXAMPLE 9

A substrate is molded of a material such as described in Example 1 and fitted with a chip. Circuit traces are printed with Polymer Thick Film that connect to the chip as in Examples 1 through 7 to form a smart card.

Industrial Applicability

While the present invention has been described with respect to preferred embodiments, numerous modifications, changes, and improvements will occur to one skilled in the art without departing from the spirit and scope of the invention.

The electronic packaging industry has a concern when ceramic components are attached to circuit board materials made of polymers because the thermal coefficient of expansion of the polymers and the ceramic are so different that stresses occur in interconnection joints due to temperature changes. For this reason surface mounted ceramic devices are normally less that 10 millimeters. However our laboratory tests have proved that a ceramic inserted component or subassembly held in a Polyimide molded pocket that is 12.5 millimeters by 25 millimeters, and secured by a thermal setting adhesive, will withstand repeated thermal cycling without cracking, delaminating, losing continuity, or changing in resistance. These test were from approximately –40° C. to a maximum temperature that was increased as the number of cycles progressed. The maximum temperature started at 80° C.; the test was terminated with no failures of the test patterns when the maximum temperature reached 180° C. These test provide evidence that the inserted component as constructed in the description of this patent is more reliable than traditional surface mount devices.

Another concern of one skilled in the art is whether printed traces could be prepared reliably as the traces must pass over a parting line where the ceramic insert and the polymer pocket meet. Our lab tests demonstrate it is difficult to print across the gap that exists if the gap is more than about 0.02 to 0.04 millimeters. Laboratory testing to date show that filling that gap with polymer materials is important to providing the necessary print surface for a sharp circuit trace image, and giving the trace the durability to pass the different stress forces such an interconnection joint might be expected to encounter. Our tests indicate that a gap >0.02 mm and <0.04 mm needs to be filled with dielectric filling material. In our lab tests we have used thermoset materials, but results indicate in certain cases materials similar to a liquid photoimagable solder mask would be preferred. Liquid photoimagable material can be applied in such a way that it levels by reason of gravity forces and natural surface tension. This allows for the filling of the gap and making the gap level with the rest of the planar surface. Photoimaging of the vias through which printed interconnections is made is accurately done with this process, and this is important when making small constructions with narrow, tight tolerance prints.

To date I have found that ceramic inserts in the range of 0.5 millimeters thickness is preferred for insert components. This is about ⅓ the thickness of traditional circuit board materials, and therefore a pocket will be supported by plastic roughly twice the thickness of the ceramic. It may be possible, however, that thinner ceramic will have advantages, especially when the plastic substrate thickness is also thinner.

What is claimed is:

1. An electronic package structure comprising:
   a molded substrate having first and second opposing surfaces, and
   an electronic device disposed on one of the said surfaces:
      said molded substrate having a molded pocket on one of said opposing surfaces into which said electronic device is supported in said pocket;
      wherein said electronic device is connected via Polymer Thick Film printed on the surface of said molded substrate and exposed surface of the electronic device contained in the molded pocket.

2. The structure of claim 1, wherein said printed surface of said molded substrate and terminal sites of said exposed surface of the electronic device contained in the molded pocket lie substantially in a plane.

3. A structure as defined by claim 1, wherein said printed surface of said molded substrate and terminal sites of the exposed surface of the electronic device contained in the molded pocket are in a non-planer configuration to each other.

4. The structure of claim 1, wherein contact surfaces of said electronic device are sealed with a printed insulating layer leaving a via through which a device is attached to the trace with Polymer Thick Film ink.

5. The structure of claim 1, wherein said electronic device is a passive component.

6. The structure of claim 1, wherein said electronic device is an active component.

7. The structure of claim 1, wherein said electronic device is an electromechanical device.

8. The structure of claim 1, wherein said electronic device is an connector pin.

9. The structure of claim 1, wherein said electronic device is an bioelectrical functional component.

10. The structure of claim 1, wherein said electronic device is a Thick Film construction.

11. The structure of claim 1, wherein said electronic device is a Polymer Thick Film construction.

12. The structure of claim 1, wherein said electronic device is ball-grid array.

13. The structure of claim 1, wherein said electronic device is a chip scale package.

14. The structure of claim 1, wherein said electronic device is a Multichip Module.

15. The structure of claim 1, wherein said electronic device is an integrated circuit.

16. The structure of claim 1, wherein said electronic device is a semiconductor.

17. The structure of claim 1, wherein said electronic device is a subassembly.

18. An electronic package structure comprising:
   a molded substrate having first and second opposing surfaces,
   and an electronic device disposed on one of the said surfaces:
      said molded substrate having a molded pocket on one of said opposing surfaces into which said electronic device is supported in said pocket; and
      Polymer Thick Film inks are used to print the circuitry on the substrate, but not connect to the said electronic device; and
      A second Polymer Thick Ink is used to connect the first Polymer Thick Film circuit and the exposed surface of said electronic device contained in the molded pocket.

19. The structure of claim 1, wherein the connection is made to termination sites of an electronic device with a non-conductive Polymer Thick Film ink and both the ink and the termination sites subsequently accepts copper plating to become conductive and simultaneously connected.

20. The structure of claim 1, wherein the terminal sites of the said electronic device does not accept copper plating but is connected by the adhesion of the printed conductive Polymer Thick Film ink and whereby the Polymer Thick Film ink is both conductive in itself and accepts copper plating to enhance its conductivity or solderability.

21. The structure of claim 1, wherein said electronic device connected to a Polymer Thick Film ink that accepts copper plating to become conductive and solderable, and wherein the electronic connection to the electronic device is enhanced with a solder joint.

22. The structure of claim 18 where the solder replaces the second conductive Polymer Thick Film ink.

23. The structure of claim 1, wherein said electronic device and substrate is sealed with a dielectric insulating print, and openings or vias in the dielectric print provide the site through which the printed conductive Polymer Thick Film ink is connected to the electronic device.

24. An electronic package structure comprising:
a molded substrate having first and second opposing surfaces,
and an electronic device positioned in one of the said surfaces: and
said molded substrate having a molded pocket on one of said opposing surfaces into which said electronic device is supported; and
Polymer Thick Film traces are printed on opposing surface of said molded pocket, and
said pocket has vias that open to the opposing surface of said substrate; and
termination sites of said electronic device are aligned with the vias in said pocket; and
wherein said electronic device is connected through said molded vias from the opposing surface to the bottom of the pocket of the substrate; and
a conductive adhesive makes the connection between the conductive traces on the opposing surface of the substrate and the terminal sites of the electronic device.

25. The structure of claim 1, wherein a plurality of electronic devices are placed in one or more pockets in the molded substrate and interconnected by printing of the conductive Polymer Thick Film inks used to form the conductive traces of the circuit.

26. The structure of claim 1, wherein the molded substrate is molded from resin of Polyether Imide.

27. The structure of claim 1, wherein the molded substrate is molded from resin of Polyethylene Terephthalate.

28. The structure of claim 1, wherein the molded substrate is molded from resin of Polybutylene Terephthalate.

29. The structure of claim 1, wherein the molded substrate is molded from resin of Polyphenylene Sulfide.

30. The structure of claim 1, wherein the molded substrate is molded from resin of Polyamide.

31. The structure of claim 1, wherein the molded substrate is molded from resin of Liquid Crystal Polymers.

32. The structure of claim 1, wherein the molded substrate is molded from resin of Polyphenylene Oxide.

33. The structure of claim 1, wherein the molded substrate is molded from resin of Polycyclo Terethalate.

34. The structure of claim 1, wherein the molded substrate is molded from resin of rigid rod Polyphenylene.

35. The structure of claim 1, wherein the molded substrate is molded from resin of epoxies.

36. The structure of claim 1, wherein the molded substrate is molded from resin of phenolics.

37. The structure of claim 1, wherein the molded substrate is molded from resin of thermoset Polyesters.

38. The structure of claim 1, wherein the molded substrate is molded from resin of syndotactic Polystyrene.

39. The structure of claim 1, wherein the said electronic device is a leaded component.

40. The structure of claim 1, wherein the electronic device is a surface mount component.

41. An electronic smart card comprising a chip assembled according to claim 1.

42. The structure of claim 1, wherein the said electronic device is surface mounted onto the printed traces and attached by curing the Polymer Thick Film.

43. The structure of claim 1 where the plastic substrate is formed by vacuum forming.

44. The structure in claim 1 where any portion of the circuitry is shielded with a conductive layer.

45. The structure of claim 1 where
a) a dielectric insulating layer is printed over the circuit traces and attached electrical devices, and
b) a shielding layer is printed over the dielectric insulating layer and connected to a ground plane.

46. The structure of claim 1, wherein said electronic device is a printed circuit board.

47. The structure of claim 1, wherein said electronic device is a silicon chip.

48. An electronic package structure comprising:
a molded substrate having first and second opposing surfaces and a plurality of electronic devices disposed on at least one of the said surfaces:
said molded substrate having a plurality of molded pockets on at least one of said opposing surfaces into which said electronic devices are supported in said molded pockets, wherein said electronic devices are connected via a Polymer Thick Film ink trace being printed with a single print step on the surface of the said molded substrate and the exposed termination pads of the electronic devices contained in at least one of the molded pockets.

49. An electronic package structure comprising:
a molded substrate having first and second opposing surfaces and a plurality of electronic devices disposed on at least one of the said surfaces;
said molded substrate having a plurality of molded pockets on at least one of the said opposing surfaces into which said electronic devices are supported in said pockets, wherein said electronic devices are connected via a plurality of print steps of Polymer Thick Film ink traces being printed on the surface of the said molded substrate and the exposed termination pads of the electronic devices contained in at least one of the molded pockets.

50. The structure of claim 48, wherein said electronic device is a silicon chip in the form of a bare die which is inserted into at least one of the plurality of molded pockets without first mounting the silicon chip in a carrier of any type.

51. The structure of claim 48, wherein said electronic device is a chip in the form of a bare die which is inserted into at least one of the molded pockets without first mounting the chip in a carrier of any type.

52. The structure of claim 49, wherein said electronic device is a silicon chip in the form of a bare die which is inserted into at least one of the plurality of molded pockets without first mounting the silicon chip in a carrier of any type.

53. The structure of claim 49, wherein said electronic device is a chip in the form of a bare die which is inserted into at least one of the molded pockets without first mounting the chip in a carrier of any type.

54. The structure of claim 48 wherein
a) a dielectric insulating layer is printed over the circuit traces and attached electronic devices, and
b) a shielding layer is printed over the dielectric layer and connected to a ground plane.

55. The structure of claim 49, wherein a dielectric layer is applied over the components supported in said pocket and over the conductive traces.

56. The structure of claim 49, wherein
a) a dielectric insulating layer is printed over the circuit traces and attached electronic devices, and
b) a shielding layer is printed over the dielectric layer and connected to a ground plane.

57. The structure of claim 48, wherein a dielectric layer is applied over the components supported in said pocket and over the conductive traces.

* * * * *